United States Patent [19]
Gordon et al.

[11] Patent Number: 5,139,999
[45] Date of Patent: Aug. 18, 1992

[54] CHEMICAL VAPOR DEPOSITION PROCESS WHERE AN ALKALINE EARTH METAL ORGANIC PRECURSOR MATERIAL IS VOLATILIZED IN THE PRESENCE OF AN AMINE OR AMMONIA AND DEPOSITED ONTO A SUBSTRATE

[75] Inventors: Roy G. Gordon; Andrew R. Barron, both of Cambridge, Mass.; Jillian M. Buriak, Barrie, Canada

[73] Assignee: President and Fellows of Harvard College, Cambridge, Mass.

[21] Appl. No.: 490,756

[22] Filed: Mar. 8, 1990

[51] Int. Cl.$^5$ .................. H01L 37/00; C23C 16/18
[52] U.S. Cl. .................. 505/1; 505/734; 427/62; 427/126.3; 427/250; 427/252; 427/255.2; 427/255.3
[58] Field of Search .................. 427/62, 63, 123, 124, 427/126.1, 126.2, 126.3, 250, 252, 255.1, 255.2, 255.3; 505/1, 734

[56] References Cited

U.S. PATENT DOCUMENTS 4,962,088 10/1990 Micheli et al. .................. 505/734
4,983,577 1/1991 Mantese et al. .................. 505/734

FOREIGN PATENT DOCUMENTS 01024017 1/1989 Japan.
01052660 2/1989 Japan.

OTHER PUBLICATIONS

Dickinson et al., *J. Appl. Phys.*, 66(1): 444–447 (1989).
Berry et al., *J. of Crystal Growth*, 92: 344–347 (1988).
Zhang et al., *Appl. Phys. Lett.*, 55(12): 1258–1260 (1989).
Tsuruoka et al., *Appl. Phys. Lett.*, 54(18): 1808–1809 (1989).
Meinema et al., *27th Intl. Conf. of Chem. Eng.* (1989).
Spee et al., *Symp. Proc: Materials Research Society Symp.* (1989).

Primary Examiner—Shrive Beck
Assistant Examiner—Benjamin L. Utech
Attorney, Agent, or Firm—Hamilton, Brook, Smith & Reynolds

[57] ABSTRACT

A method is disclosed for the volatilization and transport of an alkaline earth metal precursor. The presence of an amine or ammonia significantly increases transport of the voltalized alkaline earth metal precursor as compared to transport under the same conditions but without the amine or ammonia.

7 Claims, 1 Drawing Sheet

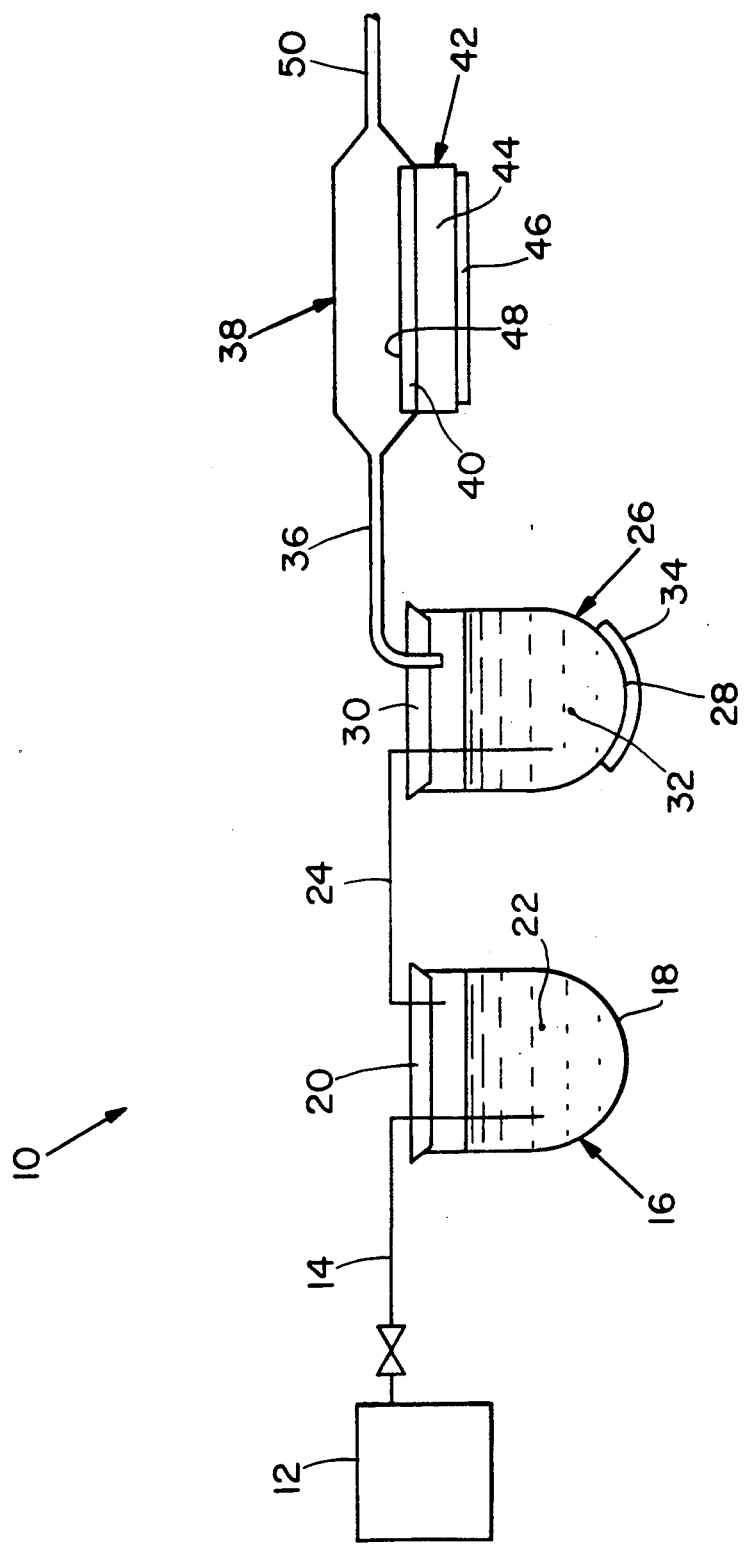

CHEMICAL VAPOR DEPOSITION PROCESS WHERE AN ALKALINE EARTH METAL ORGANIC PRECURSOR MATERIAL IS VOLATILIZED IN THE PRESENCE OF AN AMINE OR AMMONIA AND DEPOSITED ONTO A SUBSTRATE

BACKGROUND OF THE INVENTION

Alkaline earth metals have applications as components of ferroelectric, ferromagnetic and super-conducting materials. Deposition of these metals has often been difficult, however, because many of the precursor compounds, particularly compounds of barium, strontium and calcium, typically have low volatilities or significant tendencies to decompose at volatilization temperatures.

$\beta$-diketonate compounds, including those of alkaline earth metals, have been reported to be sufficiently volatile for such depositions, particularly when substituent groups of the $\beta$-diketonate are fluorocarbons. These compounds, however, are generally still not sufficiently stable for most chemical vapor deposition processes. Also, the fluorinated species often cause fluorine to be deposited with the alkaline earth metal thereby diminishing the purity and performance of deposited films.

A need exists, therefore for new methods and apparatus for depositing alkaline earth metal compounds which overcome or minimize the aforementioned problems.

SUMMARY OF THE INVENTION

The present invention relates to a new method and apparatus for volatilizing and transporting alkaline earth metal compounds.

A method for volatilizing and transporting an alkaline earth metal organic precursor includes contacting the alkaline earth metal organic precursor with an amine or ammonia during volatilization. Transport of the volatilized precursor is thereby significantly increased compared to transport under the same conditions but without contact of the amine or ammonia.

A preferred embodiment of the method of the present invention is a chemical vapor deposition (CVD) process in which an alkaline earth metal-containing material is deposited onto a substrate. A carrier gas is directed to contact an alkaline earth metal organic precursor and then directed to the substrate. The precursor is volatilized in the presence of an amine or ammonia to significantly increase transport of the volatilized precursor to the substrate compared to transport under the same conditions but without contact of the amine or ammonia. The substrate is heated to a temperature sufficient to cause the volatilized precursor to decompose within the CVD chamber resulting in deposition of the alkaline earth metal-containing material on the substrate.

Apparatus for chemical vapor deposition of an alkaline earth metal-containing material onto a substrate includes means for directing a carrier gas to contact an alkaline earth metal organic precursor and then directing it to the substrate. Means for volatilizing the precursor in the presence of an amine or ammonia are provided which significantly increases transport of the volatilized precursor compared to transport under the same conditions but without contact of the amine or ammonia. Means for heating the substrate in a CVD chamber to a temperature sufficient to cause the volatilized precursor to decompose and to deposit the alkaline earth metal-containing material onto the substrate are also provided.

This invention has many advantages. In general, the amine or ammonia significantly increases transport of the volatilized alkaline earth metal precursors compared to transport under the same conditions but without contact of the amine or ammonia. It also provides a convenient technique for volatilizing and transporting alkaline earth metal precursors which otherwise could not be volatilized, such as barium acetacetonate, or which were difficult to volatilize. Increased transport of volatilized alkaline earth metal precursors increases the deposition rate of alkaline earth metal-containing materials which can be obtained by chemical vapor deposition. Deposition of alkaline earth metal-containing materials can be performed continuously over longer periods of time, thereby enabling results which are more easily reproduced. Further, contaminating atoms, such as fluorine, can be avoided because non-fluorinated precursors or compounds can be volatilized and transported by the method and apparatus of this invention.

DETAILED DESCRIPTION OF THE DRAWING

The FIGURE is a schematic illustration of an apparatus for chemical vapor deposition according to the invention.

DETAILED DESCRIPTION OF THE INVENTION

The features and other details of the method and apparatus of the invention will now be more particularly described with reference to the accompanying drawing and pointed out in the claims. It will be understood that the particular embodiments of the invention are shown by way of illustration and not as limitations of the invention. The principal features of this invention can be employed in various embodiments without departing from the scope of the invention.

In a preferred embodiment of the present invention, CVD system 10, illustrated in the FIGURE, employs a carrier gas originating from a carrier gas source 12, which can be a cylinder of compressed gas. The carrier gas can be a reactive gas, such as air, which provides oxygen to react with a volatilized precursor or an inert gas such as helium, nitrogen or argon. The carrier gas is passed through conduit 14, comprising a suitable tubing of glass, ceramic, stainless steel or other metal, polymer such as Teflon ® polytetrafluoroethylene, rubber etc., into transport agent bubbler 16, which includes transport agent vessel 18 and cover 20 on transport agent vessel 18. Transport agent vessel 18 can be constructed of a suitable material such as glass or steel. Conduit 14 extends through cover 20 into liquid transport agent 22 within transport vessel 18. The carrier gas is bubbled through liquid transport agent 22 in transport agent vessel 18 to thereby volatilize transport agent 22. Transport agent bubbler 16 can be heated by a heater, not shown, such as an electrical resistance heater, an oil bath, or a medium recirculating through a jacket at transport agent vessel 18 to increase the rate of volatilization of the transport agent.

The carrier gas and volatilized transport agent are transported from transport agent bubbler 16 through conduit 24 to precursor bubbler 26. Conduit 24 is comprised of a tubing material such as is suitable for conduit 14. Precursor bubbler 26 includes precursor vessel 28 and cover 30 on precursor vessel 28. Precursor bubbler 26 can be constructed of a suitable material such as glass or steel. Conduit 24 extends through cover 30 into close proximity with precursor 32 within precursor bubbler 26. The carrier gas and transport agent can be bubbled through precursor 32 in percursor bubbler 26 when precursor 32 is in liquid form. Alternatively, the carrier gas and transport agent can be directed from conduit 24 to contact precursor 32 contained within a suitable vessel when precursor 32 is a solid. The carrier gas can be passed over the surface of a solid, or if the solid is granular, through a granular bed. Precursor 32 is thereby exposed to the transport agent and volatilized. Heater 34, at precursor vessel 28, can be used to heat precursor 32 and thereby increase the rate of volatilization of precursor 32 by the volatilized transport agent. Heater 34 can be, for example, an electrical resistance heater, an oil bath, or a recirculating medium through a jacket. CVD system 10 can also be disposed in an oven, not shown, to heat transport agent bubbler 16 and precursor bubbler 26. Volatilization of transport agent 22 and precursor 32 can be controlled by the oven temperature and by cooling transport agent bubbler 16 and precursor bubbler 26 by a cooling medium, such as water, which can be flowed around either, or both of the bubblers. Under some circumstances, such as under high vacuum and/or in the presence of the most volatile transport agents such as ammonia or trimethylamine, precursor 32 can be volatilized without the need for any carrier gas.

The volatilized precursor and volatilized transport agent are transported by the carrier gas from precursor bubbler 26 through conduit 36 to CVD chamber 38. Conduit 36 can be formed of a suitable tubing, such as is used for conduit 14 and conduit 24. Substrate 40 is disposed within CVD chamber 38. CVD chamber 38 can be constructed of a suitable material, such as glass, quartz or stainless steel. Heater 42 is proximate to substrate 40 for heating substrate 40 and is disposed outside of CVD chamber 38. Heater 42 can be, for example, a radiant heater, such as wherein heater 42 comprises a block 44 of metal, such as nickel, which is heated by an electrically resistant coil 46. Heater 42 can also be, for example, an infrared heater, not shown, or an inductive coil, also not shown, wrapped about CVD chamber 38.

The volatilized alkaline earth metal precursor is transported to CVD chamber 38 containing substrate 40, which is heated to a temperature sufficient to cause decomposition of the precursor in CVD chamber 38 thereby resulting in deposition of film 48 of an alkaline earth metal-containing material on substrate 40. The alkaline earth metal containing material may or may not be a chemical compound. Carrier gas, transport agent and remaining volatilized earth metal precursor are exhausted from chemical vapor deposition chamber 38 through conduit 50 of suitable tubing, such as that used for conduits 14, 24 and 36.

Alkaline earth metal precursor 32 comprises any alkaline earth metal compound which can be volatilized and transport of which is significantly increased when precursor 32 is in contact with the transport agent compared to transport under the same conditions but without contact of the transport agent. The reason that contact between the transport agent and the alkaline earth metal precursor results in better volatility and transport is not fully understood. A theory which satisfactorily explains these phenomena has not yet been developed. It is believed, however, that in any event, at least in some cases, the contact of amines or ammonia with the alkaline earth metal precursor causes increased volatility of the precursor and/or a decreased tendency of the volatilized precursor to decompose prematurely.

In a preferred embodiment of the present invention, the alkaline earth metal is selected from the group comprising calcium, barium and strontium. The alkaline earth metal can be included in an organic compound. The preferred organic compounds are β-diketonates having the following formula:

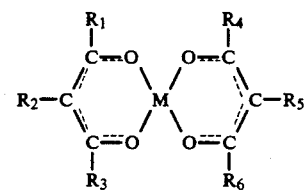

M is the alkaline earth metal. $R_{1,2,3,4,5,6}$ are individually selected from hydrogen, alkyl, aryl, alkoxy, including substituted alkyl, aryl and alkoxy groups. An example of a suitable β-diketonate for use with the present invention includes barium dipivaloylmethane $(Ba(dpm)_2)$, wherein $R_{1,3,4,6}$ are tertiary butyl groups and $R_{2,5}$ are hydrogen groups. Another example of a suitable β-diketonate is barium hexafluoroacetylacetonate $(Ba(hfa)_2)$, wherein $R_{1,3,4,6}$ are fluorinated methyl groups and $R_{2,5}$ are hydrogen groups. A third example of a suitable β-diketonate is barium acetylacetonate where $R_{1,3,4,6}$ are methyl groups and $R_{2,5}$ are hydrogen groups. Other β-diketonates suitable for use in the present invention are described in "Comprehensive Coordination Chemistry," 3.1 (Eds. G. Wilkinson, R. D. Gillard, J. A. McCleverty) Pergamon Press. Oxford. (1987), the teachings of which are hereby incorporated by reference. Other suitable metal organic for use in the precursor include alkoxy ethers, such as methyldiethyleneglycol, $MeOC_2H_4OC_2H_4OH$.

The alkaline earth metal organic precursor decomposes within the CVD chamber to deposit an alkaline earth metal compound. Examples of alkaline earth metal compounds deposited are alkaline earth metal oxides, which can be deposited by decomposition of $Ba(dpm)_2$ onto substrate 40, and alkaline earth metal fluorides, which can be deposited by decomposition of $Ba(hfa)_2$ onto substrate 40.

Transport agent 22 significantly increases transport of the volatilized precursor as compared to transport under the same conditions but without contact of the transport agent. Suitable transport agents include amines which are volatile and do not decompose under conditions at which the precursor decomposes. Preferred amines are those that are the most volatile because they are the easiest to volatilize for contact with precursor 32. Examples of a suitable amines include: monodentates, such as the trialkylamines, trimethylamine and triethylamine; and multidentates, such as ethylenediamine and N,N,N,N-tetramethylethylenediamine. Other suitable amines include: primary amines, such as ethylenediamine; secondary amines, such as dimethylamine; and tertiary amines, such as trialkylamines, trimethylamine, pyridine and triethylamine. Also, transport agent 22 can operate additionally as the carrier gas. For example, ammonia or trimethylamine can be used to transport the precursor without introduction of an additional gas. Further, mixtures of ammonia and amines can be used to form transport agent 22 for volatilization of precursor 32 in precursor bubbler 26.

The preferred transport agent for use in the present invention is ammonia because the combination of ammonia and precursor typically is less flammable than combination of amines with suitable precursors volatilized by the method of the present invention. Also, ammonia is typically gaseous at atmospheric pressure and, therefore, a carrier gas is generally not needed to bubble ammonia through precursor 32 in precursor bubbler 26. Further, ammonia is often less expensive than are suitable amines.

Substrate 40 is comprised of a material on which an alkaline earth metal-containing material can be deposited. Examples of such substrate materials include silicon, glass boron, metals and any other sufficiently refractory material. The volatilized precursor decomposes within CVD chamber 38 and thereby deposits on substrate 40 to form film 48. The presence of carbon in film 48 of alkaline earth metal compound can be reduced by introducing an oxidant into CVD chamber 38 during deposition of the alkaline earth metal compound.

Although it is customary to employ heat to volatilize precursors and transport agents, other techniques can sometimes be employed. One example is the use of vacuum in the apparatus employed.

Other methods, such as spin coating techniques, can be used to deposit alkaline earth metal compounds by the method of the present invention. In a typical spin coating technique, a solution of transport agent and precursor is formed which is deposited onto the center of a substrate on a spinning wheel. The substrate on the wheel is heated to decompose the precursor and to dissipate the transport agent. Centrifugal force imparted to the solution by the spinning wheel distributes the solution, whereby the precursor decomposes and is deposited onto the substrate.

The method of the present invention is useful for deposition of alkaline earth metal compounds onto substrates by chemical vapor deposition or by other processes. The present invention can be used to form ferromagnetic materials, such as barium ferrite, and ferroelectric materials, such as barium titanate. The present invention is particularly suitable for depositing oxides with a high superconducting transition temperature, such as yttrium barium copper oxide ($YBa_2Cu_3O_{7-x}$, wherein x is between 0 or 1) and bismuth strontium calcium copper oxide ($Bi_2Sr_2CaCu_2O_{9-x}$). It is also suitable for forming barium fluoride glass, for example, such as is used for optical windows of heat-seeking missiles.

The method of volatilizing and transporting alkaline earth metal precursors by the method of the present invention is also suitable for purification of alkaline earth metal compounds, such as by selective distillation. A typical selective distillation method using the method of the present invention includes heating an impure alkaline earth metal precursor to volatilize relatively low boiling impurities which include, for example, silicon and aluminum compounds. The material is then heated in the presence of ammonia to contact the alkaline earth metal compound with the ammonia to thereby volatilize and transport the alkaline earth metal precursor from the solution. Substantially non-volatile impurities remain following volatilization of the alkaline earth metal precursors.

Another application of the present invention includes volatilizing alkaline earth metal precursors for introduction to separation media, such as that done in gas chromatography. The invention thus facilitates chromatographic separation of alkaline earth metal compounds.

EXAMPLE I

Barium oxide was deposited by chemical vapor deposition using apparatus as shown in the FIGURE. A carrier gas comprising dry air from a cylinder and at atmospheric pressure was conducted through a transport agent bubbler and a precursor bubbler at a flow rate of about 5.0 liters per minute. The transport agent bubbler was glass and had a volume of about 60 cubic centimeters contained liquid triethlyamine at a temperature of about 25° C. The precursor bubbler was constructed of glass and had a volume of about 20 cubic centimeters. The precursor bubbler contained relatively pure $Ba(dpm)_2$. The chemical vapor deposition chamber was constructed of glass and had dimensions of 1 cm$\times$40 cm$\times$8 cm. All conduits were constructed of stainless steel. The carrier gas was directed from the precursor agent bubbler to the chemical vapor deposition chamber wherein a silicon substrate (P doped [1,1,0]) having a surface area of about 10 cm$^2$ was disposed. The substrate was heated to a temperature of about 500° C. by a heater comprising a block of nickel and an electrically resistant coil. A blue film formed on the substrate having a thickness of about 300 nanometers during a deposition period of about 60 minutes. X-ray photoelectron spectroscopy tests indicated that the film was comprised of substantially pure barium oxide, having no detectable amounts of carbon or nitrogen present.

EXAMPLE II

The chemical vapor deposition of Example I was repeated wherein tetramethylethylene diamine was substituted as the transport agent for triethylamine. Equivalent deposition of barium oxide resulted.

EXAMPLE III

The chemical vapor deposition of Example I was repeated with no transport agent present. Only a trace of film was deposited on the substrate.

EXAMPLE IV

Example II was repeated using barium acetylacetonate as the alkaline earth metal organic precursor. $R_{1,3,4,6}$ of the general $\beta$-diketonate formula, described supra, were methyl groups and $R_{2,5}$ were hydrogen groups. An equivalent barium oxide film on the substrate to that obtained for Examples I and II was deposited.

EXAMPLE V

The chemical vapor deposition of Example IV was repeated without the presence of a transport agent. No film was detected on the silicon substrate following the deposition period.

EXAMPLE VI $Ba(dpm)_2$ was sublimed from the precursor bubbler using trimethylamine as the transport agent and carrier gas. The precursor bubbler was at a temperature of approximately 100° C. and the precursor sublimed at a rate of about 0.1% per minute.

EQUIVALENTS

Those skilled in the art will recognize or be able to ascertain using no more than routine experimentation, many equivalents to the specific embodiments of the invention described specifically herein. Such equivalents are intended to be encompassed in the scope of the following claims.

We claim:

1. In a method for volatilizing an alkaline earth metal organic precursor and transporting the volatilized precursor:

the improvement comprising volatilizing an amine or ammonia and then contacting said alkaline earth metal organic precursor with the volatilized amine or ammonia during volatilization of the alkaline earth metal organic precursor, whereby volatilization and transport of the volatilized precursor are significantly increased compared to volatilization and transport under the same conditions but without contact of the volatilized amine or ammonia with the precursor, thereby assisting volatilization and transport of the alkaline earth metal organic precursor.

2. In a method for volatilizing an alkaline earth metal organic precursor and transporting the volatilized precursor to a substrate to deposit thereon an alkaline earth metal-containing material:

the improvement comprising voliatilizing an amine or ammonia and then contacting said alkaline earth metal organic precursor with the volatilized amine or ammonia during volatilization, whereby volatilization and transport of the volatilized precursor to the substrate are significantly increased compared to volatilization and transport under the same conditions but without contact of the volatilized amine or ammonia with the precursor, thereby assisting volatilization of the alkaline earth metal organic precursor and assisting transport of the volatilized precursor to the substrate to deposit thereon the alkaline earth metal-containing material.

3. A method of claim 2 wherein the alkaline earth metal organic precursor comprises a $\beta$-diketonate.

4. A method of claim 3 wherein ammonia is volatilized and then contacted with the $\beta$-diketonate.

5. A chemical vapor deposition process for depositing an alkaline earth metal-containing material onto a substrate, comprising:

a) directing a carrier gas to contact an alkaline earth metal organic precursor and then directing it to the substrate contained in a CVD chamber;

b) volatilizing the precursor in the presence of an amine or ammonia to thereby significantly increase transport of volatilized precursor in the carrier gas to the substrate compared to transport under the same conditions but without the presence of the amine or ammonia; and c) heating the substrate to a temperature sufficient to cause the volatilized precursor to decompose within the CVD chamber thereby resulting in deposition of the alkaline earth metal-containing material on the substrate.

6. A method of claim 5 wherein the alkaline earth metal organic precursor comprises a $\beta$-diketonate.

7. A method of claim 6 wherein the precursor is volatilized in the presence of ammonia.

* * * * *